United States Patent
Oishi

(10) Patent No.: US 6,914,666 B2
(45) Date of Patent: Jul. 5, 2005

(54) METHOD AND SYSTEM FOR OPTIMIZING PARAMETER VALUE IN EXPOSURE APPARATUS AND EXPOSURE APPARATUS AND METHOD

(75) Inventor: Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/659,194

(22) Filed: Sep. 9, 2003

(65) Prior Publication Data

US 2004/0174507 A1 Sep. 9, 2004

(30) Foreign Application Priority Data

Sep. 10, 2002 (JP) ........................................ 2002-263578

(51) Int. Cl.[7] .......................... G03B 27/42; G03B 27/32
(52) U.S. Cl. .......................................... 355/53; 355/77
(58) Field of Search .............................. 355/52, 55, 77; 356/399–401; 250/548; 430/311

(56) References Cited

U.S. PATENT DOCUMENTS

| 5,656,402 A | * | 8/1997 | Kasuga | 430/22 |
| 6,538,721 B2 | * | 3/2003 | Okita et al. | 355/53 |
| 6,639,677 B1 | * | 10/2003 | Ina et al. | 356/401 |
| 2003/0059691 A1 | * | 3/2003 | Morimoto | 430/22 |

* cited by examiner

Primary Examiner—Henry Hung Nguyen
(74) Attorney, Agent, or Firm—Morgan & Finnegan, L.L.P.

(57) ABSTRACT

An exposure method includes the steps of acquiring information of an alignment mark formed on an object to be exposed, by changing a value of a device parameter, the information being used for an alignment between a reticle and the object, the reticle forming a circuit pattern to be transferred to the object, and the value being able to be set in an exposure apparatus, determining the value of the device parameter of the exposure apparatus based on the information acquired in the acquiring step, and transferring the pattern onto the object using the exposure apparatus that sets the value of the device parameter, which has been determined.

18 Claims, 21 Drawing Sheets

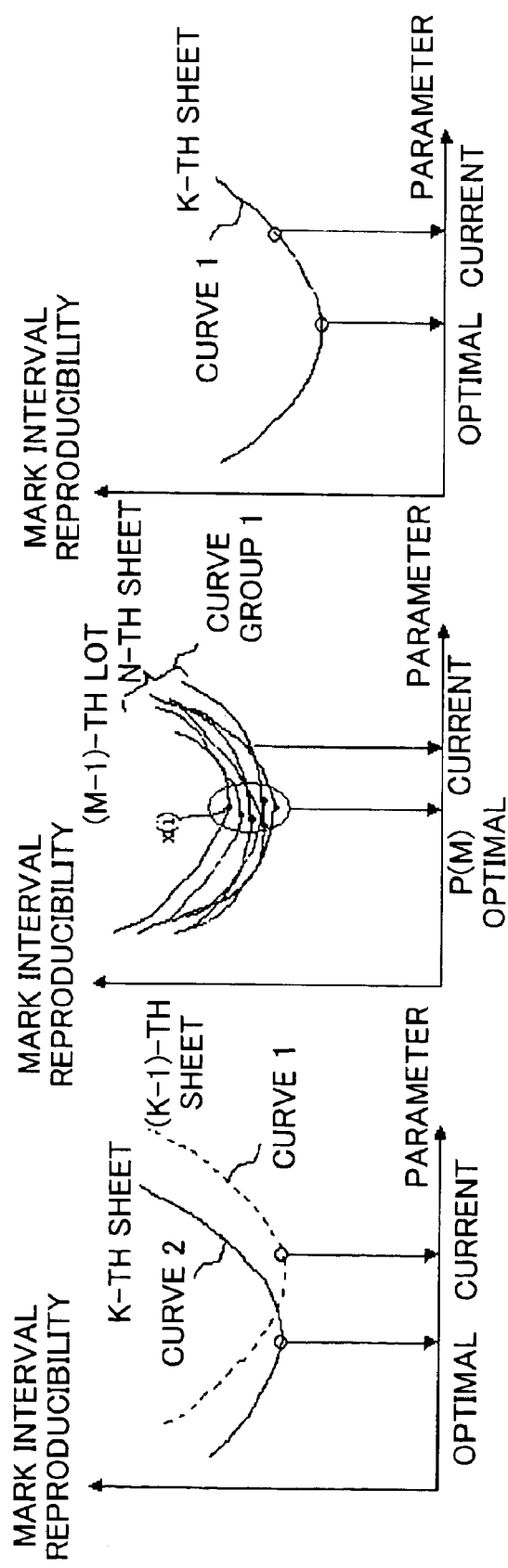

METHOD AND SYSTEM FOR OPTIMIZING PARAMETER VALUE IN EXPOSURE APPARATUS AND EXPOSURE APPARATUS AND METHOD

This application claims a benefit of foreign priority based on Japanese Patent Application No. 2002-263578, filed on Sep. 10, 2002, which is hereby incorporated by reference herein in its entirety as if fully set forth herein.

BACKGROUND OF THE INVENTION

The present invention relates generally to projection exposure methods and apparatuses used to expose an object, such as a single crystal substrate or a spherical semiconductor for a semiconductor wafer, and a glass plate for a liquid crystal display ("LCD") in photolithography, and more particularly to a method for optimizing one or more values of device parameter(s). Here, the "device parameter" is a parameter which may be set in an exposure apparatus, defines an exposure condition, an illumination condition of an alignment optical system, etc., and is relevant to an alignment between a reticle and the object to be exposed. The inventive exposure method and apparatus are suitable for precise and prompt alignments under circumstances where Wafer Induced Shift ("WIS") as a wafer process error may occur.

Projection exposure apparatuses used to manufacture semiconductor devices have been required to expose a circuit pattern on a reticle onto a wafer at high resolution along with fine and high-density circuits. The projection resolving power of a circuit pattern depends upon a numerical aperture ("NA") of a projection optical system and a wavelength of exposure light, and methods to achieve high resolution include a method to increase an NA of a projection optical system and a method to use exposure light having a shorter wavelength. Regarding the latter method, an exposure light source has shifted from g-line to i-line and from i-line to the excimer laser. Exposure apparatuses that use the excimer laser having an oscillation wavelength of 248 nm and 193 nm have already been reduced to practice. At present, those exposure methods have been currently studied for the next generation, which use vacuum ultraviolet ("VUV") having a wavelength of 157 nm and extreme ultraviolet ("EUV") having 13 nm.

Manufacture processes of semiconductor devices are diversified, and the planation technology for solving a problematically small depth of focus in an exposure apparatus have called attention, such as a Tungsten Chemical Mechanical Polishing ("W-CMP") process, Cu dual damocene wiring technology, and technology that applies a low dielectric constant ("Low-k") material to an interlayer dielectric.

There have been proposed a wide variety of structures and materials for semiconductor devices, for example, Pseudomorphic High Electron Mobility Transistor ("P-HEMT") and Metamorphe-HEMT ("M-HEMT") made of compound such as GaAs and InP, Heterojunction Bipolar Transistors ("HBTs") that use SiGe, SiGeC, etc.

On the other hand, fine circuit patterns have required a precise alignment between a reticle (mask) that forms a circuit pattern and a wafer to which the circuit pattern is projected; the necessary precision is ⅓ of a circuit critical dimension, e.g., 60 nm that is ⅓ as long as the current design width of 180 nm.

Alignment in an exposure apparatus is usually carried out by imaging an optical image of an alignment mark formed on a wafer, onto an image pickup device, such as a CCD camera, and by image-processing an electric signal to detect a position of the mark on the wafer. In general, a non-uniform film thickness of resist near the alignment mark and an asymmetric shape of the alignment mark are influential factors that deteriorate alignment accuracy on the wafer upon alignment between the reticle and wafer. These alignment error factors caused by the wafer are referred to as WIS.

In the existing circumstances of the semiconductor industry, there are many device parameters to be set in exposure apparatuses according to types of exposure methods and products. In addition, these parameters are not independent but closely related to each other. An operator of an exposure apparatus in a device manufacturer has conventionally determined these device parameter values by trial and error, and spent a large amount of time in determining optimal parameter values. Even after the device parameters values have been determined, they often need to be reset when a process error occurs and the device parameter values need to change in accordance with changes of manufacture processes corresponding to the process error. This also requires a large amount of time.

According to the current optimization of the device parameter values, several tentative wafers are exposed and these values are determined as offsets based on a result from an overlay detector. Therefore, the present optimization is disadvantageously less responsive to process variance.

Of course, in manufacturing semiconductor devices, a manufacturing apparatus has a limited time from turning on to starting mass production, and therefore a limited time to determine these device parameter values. In addition, it is necessary to improve the operation time of the manufacture apparatus viewed from Cost of Ownership ("CoO"), and thus the device parameter values should be varied promptly. In this context, it is very difficult to manufacture a wide variety of semiconductor devices with optimal parameter values. When the alignment is not optimized, the parameter values are not optimized, and the manufacture apparatus, which would otherwise provide high yield, can provide only insufficient yield, causing deterioration of yield. This deterioration of yield would cause increased manufacture cost, lowered pack, and weakened the manufacturer's competitive power.

BRIEF SUMMARY OF THE INVENTION

Accordingly, it is an exemplified object of the present invention to provide an exposure method and apparatus, and an optimization method and system, which may optimize device parameters of an exposure apparatus by determining whether or not device parameter values that have been set to the exposure apparatus are optimal.

An exposure method of one aspect according to the present invention includes the steps of acquiring information of an alignment mark formed on an object to be exposed, by changing a value of a device parameter, the information being used for an alignment between a reticle and the object, the reticle forming a circuit pattern to be transferred to the object, and the value being able to be set in an exposure apparatus, determining the value of the device parameter of the exposure apparatus based on the information acquired in said acquiring step, and transferring the pattern onto the object using the exposure apparatus that sets the value of the device parameter, which has been determined.

The alignment mark formed on the object may include plural elements arranged at a predetermined interval, wherein the information of the alignment mark includes the interval between the plural elements.

The determining step may determine the value of the device parameter so that reproducibility of the interval between the elements in the alignment mark may improve, or so that a deviation from an average of plural intervals among the elements in the alignment mark acquired by said acquiring step may reduce, or so that the intervals among the elements in the alignment mark acquired by said acquiring step may approach a predetermined interval.

The determining step may be repeated to acquire plural determined values of the device parameter, and said transferring step uses an average of the plural determined values of the device parameter.

The device parameter may include one or more parameters for manipulating the exposure apparatus, an arrangement of sample shots used for a global alignment, and/or an illumination mode for illuminating the alignment mark.

The alignment mark formed on the object may include plural elements arranged at a predetermined interval, wherein the device parameter includes a mark width as a length of the element in an alignment measurement direction, or wherein the device parameter includes a mark line width as a width of a contour of the element.

The device parameter includes a process parameter used to process a detection signal of the alignment mark, a width of a process window, and/or a center distance of a process window.

A program that enables a computer to execute the above exposure method also constitutes one aspect according to the present invention.

An exposure apparatus for transferring a pattern formed on a reticle onto an object to be exposed includes an information acquisition part for acquiring information of an alignment mark formed on an object to be exposed, by changing the value of the device parameter, the information being used for an alignment between the reticle and the object, and an optimization part for setting the value of the device parameter to said exposure apparatus based on the information acquired.

A device fabrication method comprising the step of exposing an object using the above exposure method, and performing a development process for the object exposed. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

BRIEF DESCRIPTION OF THE DRAWINGS

FIG. 11 is a graph of a concrete example of an optimization of the first embodiment according to the present invention.

FIG. 12 is a graph of a concrete example of an optimization of the second embodiment according to the present invention.

FIG. 13 is a graph of a concrete example of an optimization of the third embodiment according to the present invention.

DETAILED DESCRIPTION OF THE PREFERRED EMBODIMENTS

A detailed description will now be given of the preferred embodiments according to the present invention, with reference to accompanying drawings. In the following description, "device setting JOB parameter values" mean a group of parameter values that are set in an exposure apparatus to expose a wafer. "device non-setting JOB parameter values" mean a group of parameter values that are not set in the exposure apparatus to expose a wafer, but may be functionally set. A "device parameter" is a parameter settable in the exposure apparatus, which defines an exposure condition and an illumination condition of an alignment optical system, and has some relationship with an alignment between a reticle and an object to be exposed.

The device parameter values include option data of set parameters, such as an arrangement of sample shots and a selection of illumination modes, which is not directly relevant to numerical values, as well as numerical values of numerically settable parameters.

Figure 1:
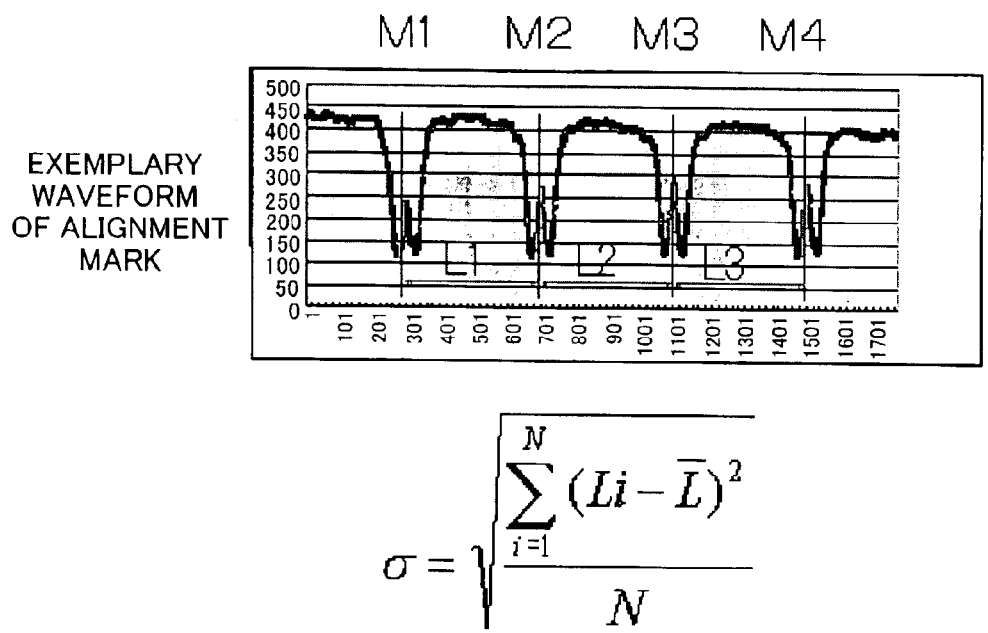
FIG. 1 is a view showing an alignment signal and a mark element interval of one embodiment.
Figure 2:
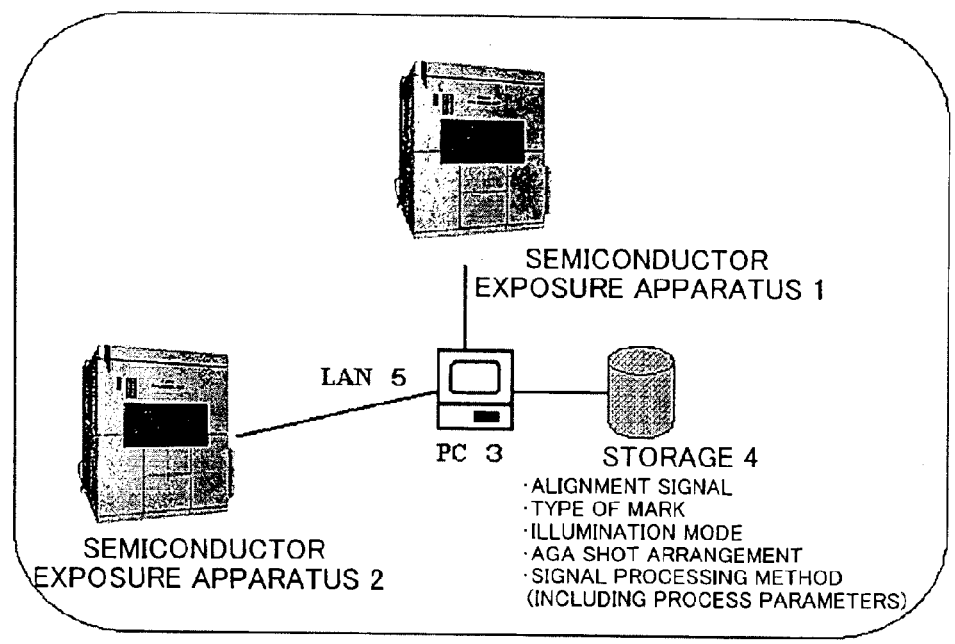
FIG. 2 shows a structure of an optimization system for optimizing a value of a device parameter in an exposure apparatus.

FIG. 2 is a structural view for implementing the instant embodiment. In FIG. 2, 1 and 2 are semiconductor exposure apparatuses for exposing a circuit pattern on a reticle onto a wafer. 3 is a CPU in a personal computer and a work station (simply referred to as "PC" hereinafter), which optimizes semiconductor device parameter values. 4 is a storage, such as a hard disk drive ("HDD"), which stores device parameters for the exposure apparatuses 1 and 2, (such as an illumination mode for illuminating an alignment mark, an arrangement of sample shots in the global alignment, and a mark line width of an element in the alignment mark), and alignment information (such as a process result of a detection signal of the alignment mark) in a form of database.

The storage 4 may be built in the exposure apparatus 1 or 2 or PC 3. This embodiment uses a network, such as, a local area network ("LAN") to connect the exposure apparatuses 1 and 2 to the PC 3 that accesses the storage 4 and realizes an optimization of the device parameter in the instant embodiment.

Figure 3:
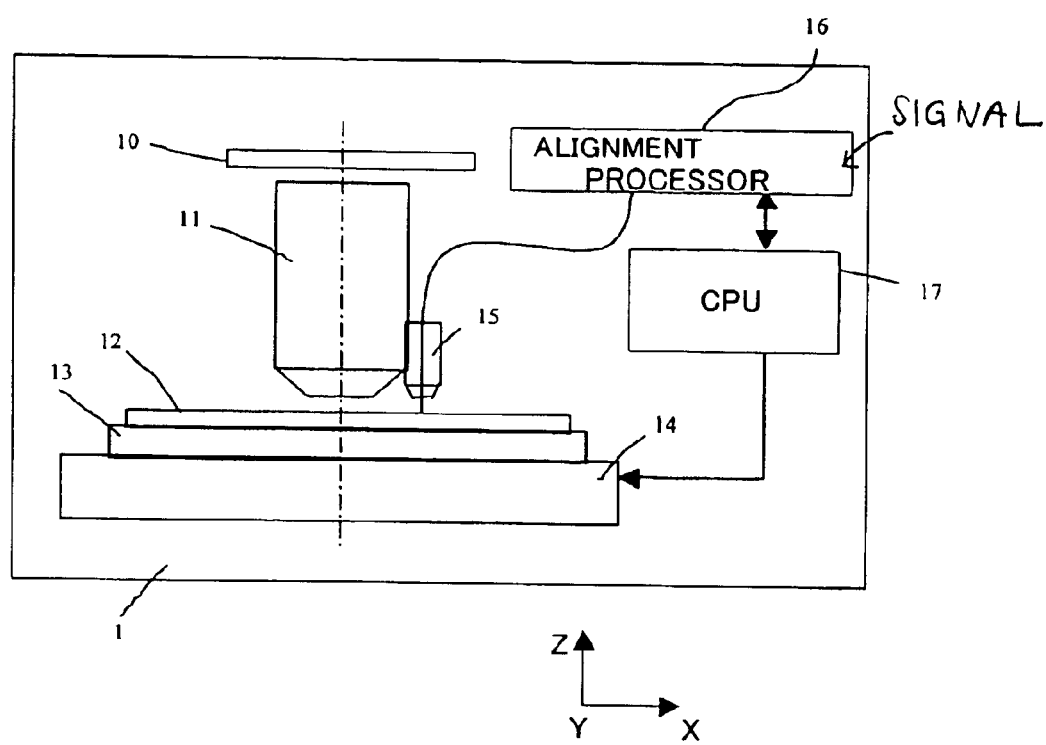
FIG. 3 is a schematic block diagram of an exposure apparatus of one embodiment.
Figure 4:
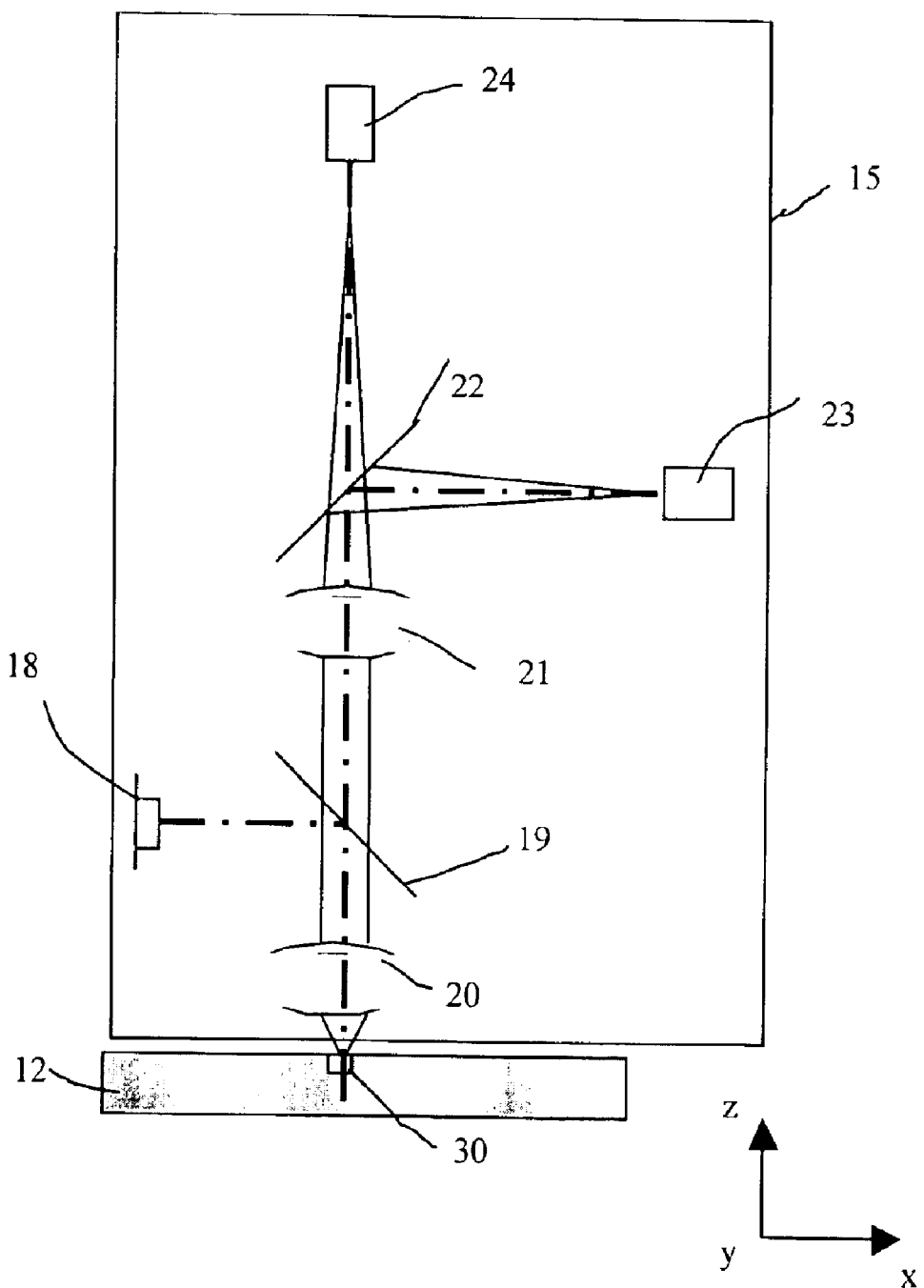
FIG. 4 is a schematic block diagram of an alignment optical system or an alignment scope shown in FIG. 3.

FIG. 3 shows a schematic diagram of a principal part of the semiconductor exposure apparatus 1. The exposure apparatus 1 includes a projection optical system 11 that projects a reticle 10 that forms a certain circuit pattern, a wafer chuck 13 for holding the wafer on which a primary pattern is formed in a previous step and an alignment mark 30 has been formed as shown in FIG. 4, a wafer stage 14 that positions the wafer 12 at a predetermined position, an alignment detection system or alignment scope 15 for measuring a position of the alignment mark on the ware 12, and an alignment signal processor 16. The PC 3 shown in FIG. 2 may serve as all or part of functions of a CPU 17. In other words, according to the present invention, the optimization process of the exposure apparatus 1 may be conducted by the exposure apparatus 1 itself or an external apparatus, such as the PC 3 shown in FIG. 2.

A description will be given of a principle of alignment detection with reference to FIG. 4. Here, FIG. 4 is a block diagram showing principal elements in the alignment detection optical system 15. The illumination light from a light source 18 reflects on a beam splitter 19, passes through a lens 20, and illuminates the alignment mark 30 on the wafer 12. The diffracted light from the alignment mark 30 passes through the beam splitter 19 and lens 21, and is divided by a beam splitter 22, and received by CCD sensors 23 and 24. Plural light sources 18 may be provided to change illumination conditions by varying a center wavelength of the illumination light or by varying the illumination light from homogeneous light to white light.

The alignment mark 30 is enlarged at about 100× magnifying power by the lenses 20 and 21, and imaged on the CCD sensors 23 and 24. The CCD sensors 23 and 24 are used to measure the alignment mark 30 in directions X and Y, respectively, and arranged with a rotational angle of 90° relative to the optical axis.

Figure 5A:
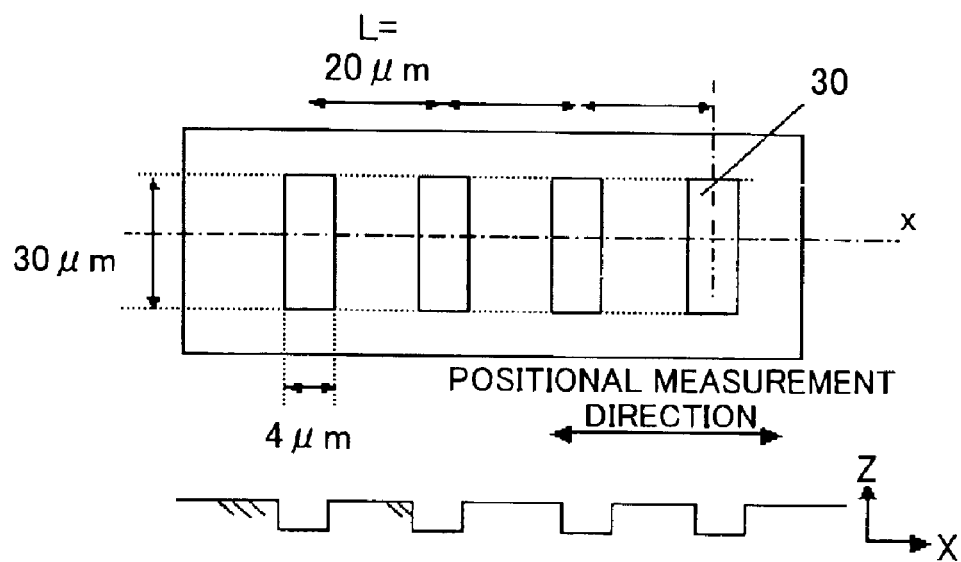
FIG. 5 shows a structure of an alignment mark shown in FIG. 3.

As the measurement principle in the direction X is the same as that in the direction Y, a description will now be given of a positional measurement only in the direction X. First, the alignment mark 30 for detecting a position will be described. As shown in FIG. 5A, the strip-shaped alignment mark 30 of the instant embodiment includes plural (or four in FIG. 5A) position-detecting marks (or sometimes referred to as "elements" of the alignment mark) 32 having a size of 4 μm in an alignment measurement direction or direction X and 30 μm in a non-measurement direction or direction Y, and they are arranged at a predetermined interval in the direction X (L=20 μm). As shown in a lower view in FIG. 5A, the element 32 structurally has a concave section as a result of etching process, and is applied onto resist (not shown) on the element 32.

FIG. 1 shows an alignment signal, which is obtained by photoelectric conversions of light received by the CCD sensors 23 and 24, which light is reflected light from plural position-detecting marks 32 onto which illumination light is irradiated. Four mark signals shown in FIG. 1 are properly processed so as to detect respective element positions (M1, M2, M3 and M4 in order from the left in FIG. 1). Intervals between the elements (L1, L2 and L3 in order from the left in FIG. 1) are now referred to as mark element intervals.

A description will now be given of reproducibility of the mark element intervals as a criterion of evaluation necessary for the present invention to optimize values of the device parameters. In general, Equation 1 below defines the reproducibility of "N" mark element intervals:

$$\sigma = \sqrt{\frac{\sum_{i=1}^{N}(Li - \overline{L})^2}{N}} \quad (1)$$

where Li is a mark element interval, $\overline{L}$ is an average of the mark element intervals, and N is the number of mark element intervals. For example, in evaluating the reproducibility of "M" marks having "K" mark element intervals, it is N=K×M. σ indicates a deviation of the mark element intervals from its average, and a value of σ times three is so-called 3σ, which is 3σ from the average of the mark element intervals.

Figure 5B:
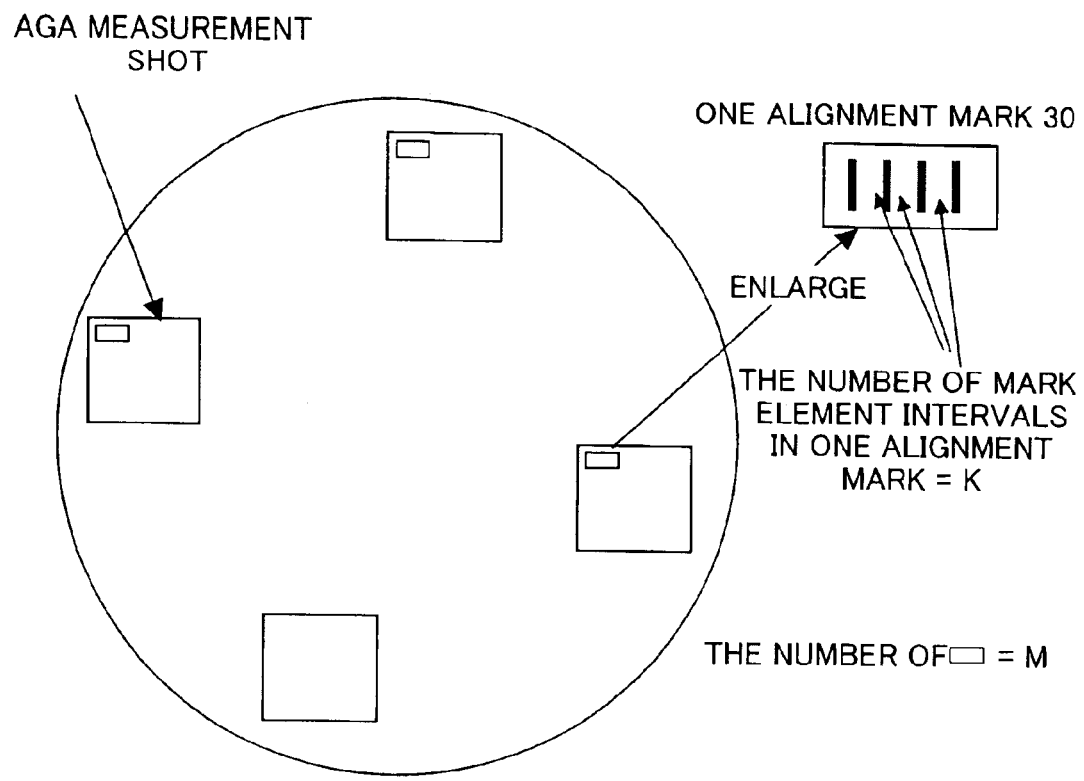

As shown in FIG. 5B, there are usually four or more shots in the following Advanced Global Alignment ("AGA"), and the total N of the mark element intervals on the wafer 12 is N=K×M where one alignment mark 30 includes plural or "M" mark elements and "K" intervals among the mark elements 32.

While Equation 1 uses $\overline{L}$ as an average of the mark, the instant embodiment is not limited to this mode. For example, the reproducibility of the mark element intervals may be defied as Equation 2 where Ld is a design value of mark element interval.

$$\sigma = \sqrt{\frac{\sum_{i=1}^{N}(Li - Ld)^2}{N}} \quad (2)$$

A description will be given of an example of a device parameter with reference to FIG. 10. The device parameter includes an arrangement of sample shots for the global alignment that utilizes a combination of Shot A to Shot L, as shown in FIG. 10A. Here, "global alignment" is an alignment method that moves a wafer stage to an exposure position based on estimate calculation of positional information. FIG. 10A shows a schematic view of AGA sample shot positions on the wafer 12.

The device parameter also includes a width and a line width of the mark element 32. While the alignment mark 30 shown in FIG. 5 has concave mark elements 32, a recent process has dented only a counter of a mark element so as to make a wafer surface as flat as possible. Therefore, as shown in FIG. 10B, the device parameter may include a mark width ML as a length of the mark element 32 in the alignment measurement direction, and a mark line width MLW as a width of the contour of the mark element 32. Here, FIG. 10B is a schematic plane view of the mark element 32.

The device parameter may also include a process parameter of a processing method of a detection signal of the alignment mark 30. For example, S(x) in a measurement direction x relative to a row of signal y is defined as Equation 3:

$$S(x) = \sum_{i=WC-\frac{WW}{2}}^{WC+\frac{WW}{2}} |y(x-i) - y(x+i)| \quad (3)$$

Figure 10C:
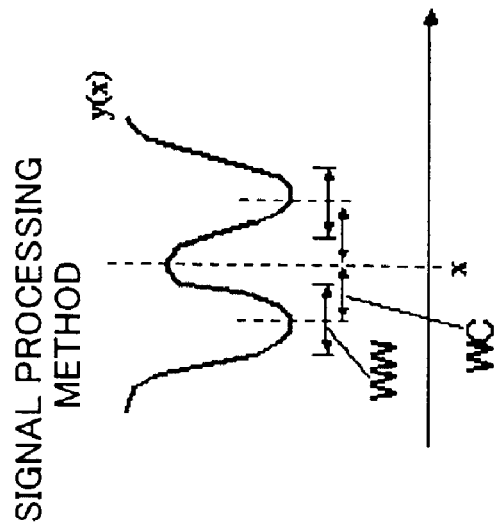
FIG. 10 is a view showing an exemplary device parameter in the inventive optimization process.
Figure 10B:
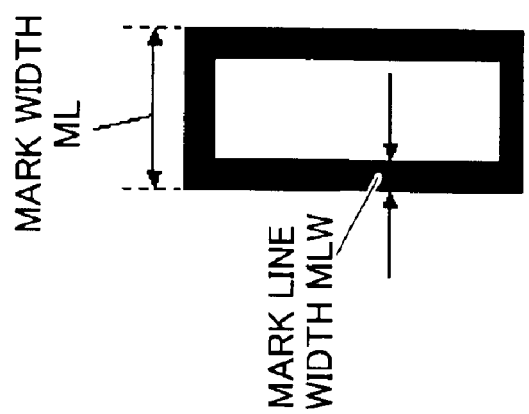
Figure 10A:
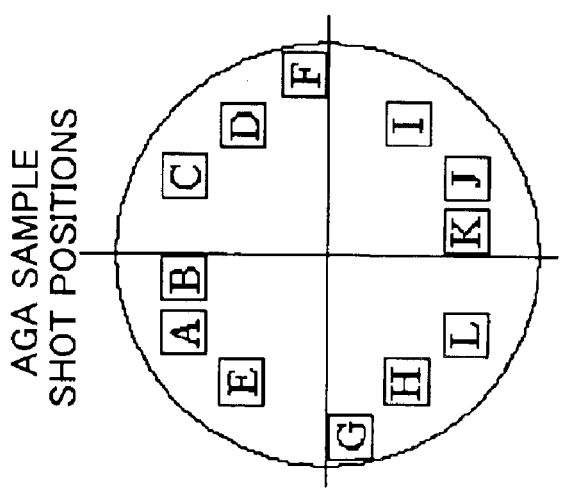
Figure 10D:
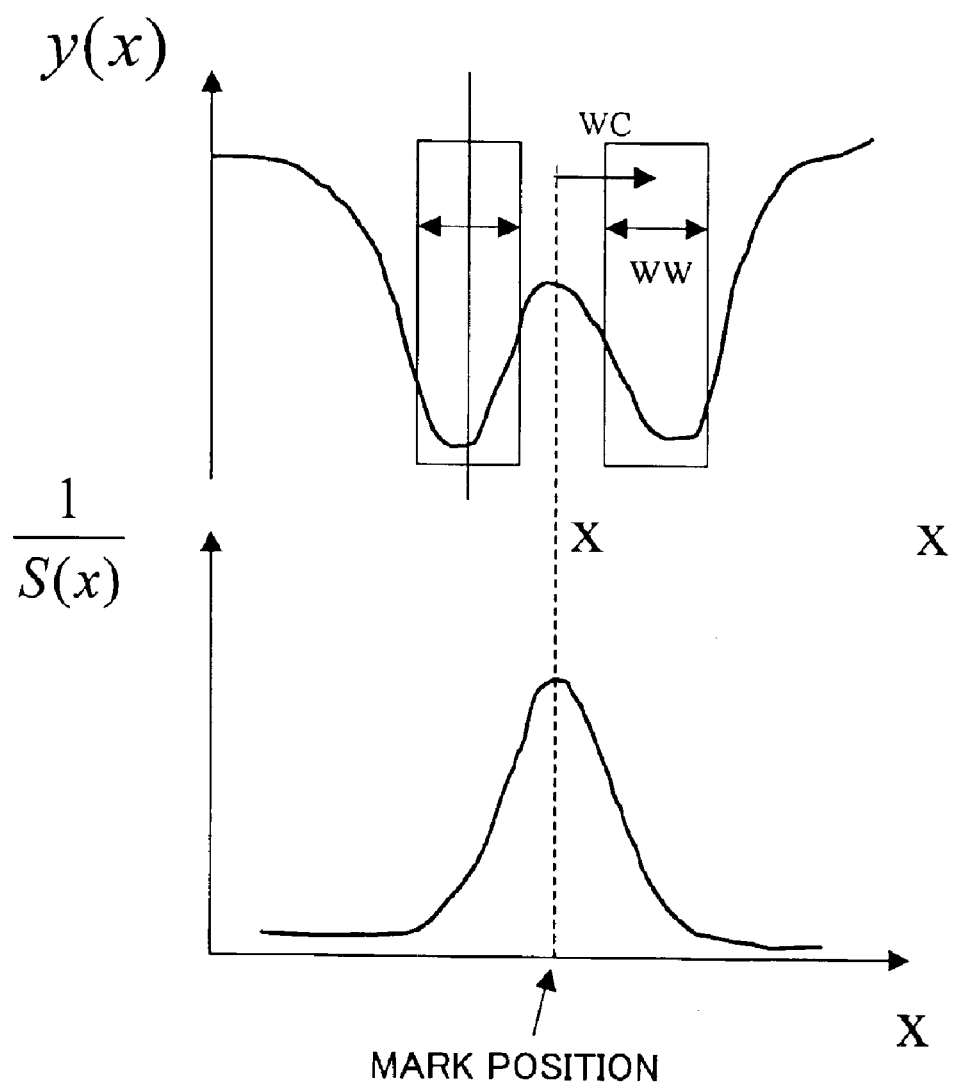

A signal processing method that sets an extreme of S(x) to be a mark center position may use such signal processing parameters as process window width WW and process window center distance WC, as shown in FIG. 10C. Equation (3) is one example of a template matching method. As shown in FIG. 10D as a concrete example of FIG. 10, S(x) at a certain point x is calculated from Equation 3, and S(x) is obtained by changing x. A mark position is set to be the minimum (or lowest) value of this S(x) or the maximum (or highest) value of 1/S(x) shown in FIG. 10D.

Figure 6:
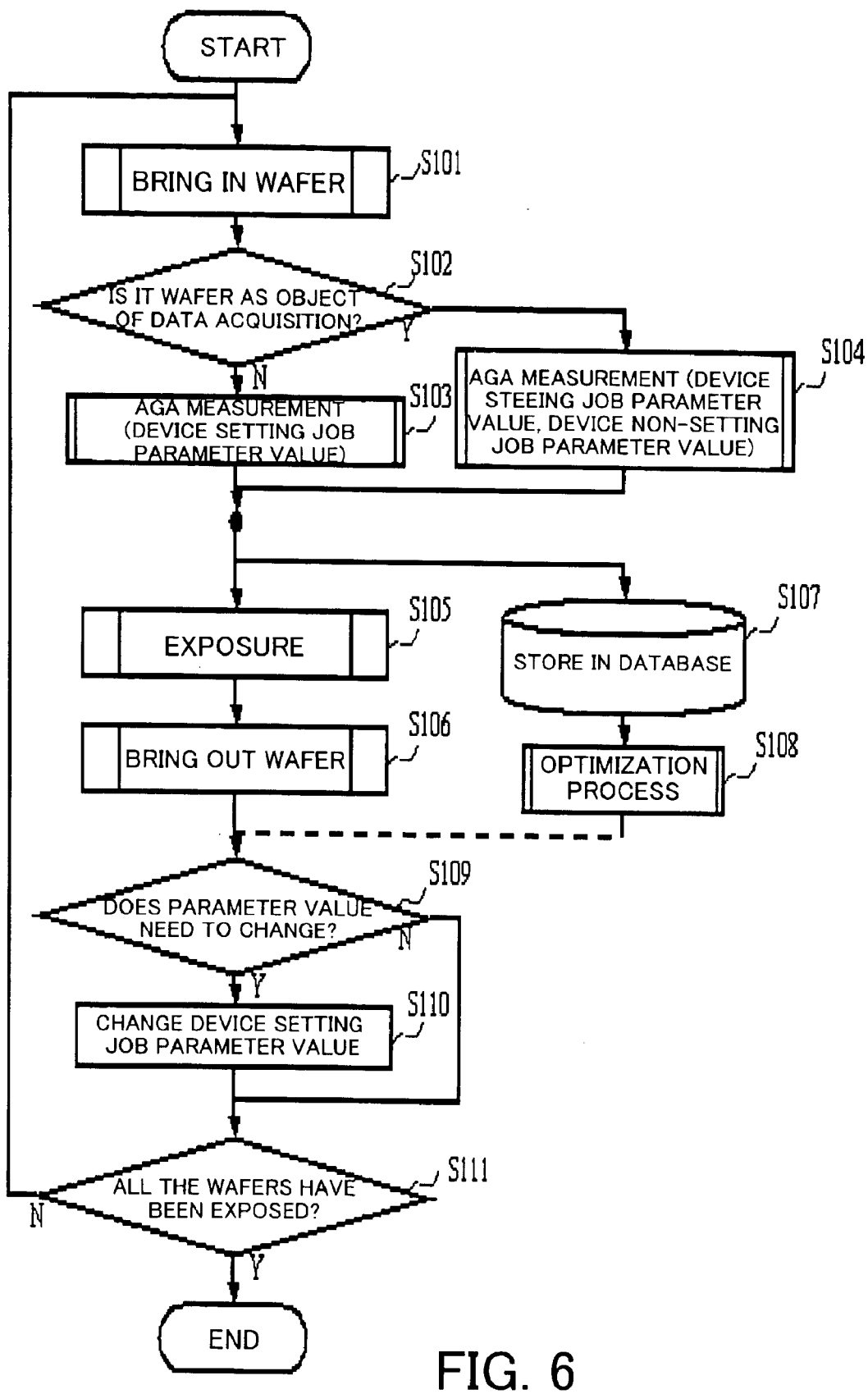
FIG. 6 is a flowchart of an optimization process of a first embodiment according to the present invention.

FIG. 6 is a flowchart showing an optimization of a first embodiment according to o the present invention. FIG. 6 shows an optimization process of a device parameter for each wafer 12. First, the CPU 17 in the exposure apparatus 1 confirms that the wafer 12 has been brought in by using a sensor (not shown) etc. (step S101), and determines, based on an identifier formed on the wafer 12 or an external input, whether the wafer 12 is a wafer as an object for which data is to be acquired with values of the device non-setting JOB parameters (step S102).

The CPU 17 commands the alignment scope 15 and alignment signal processor 16 to perform an AGA measurement with device setting and non-setting JOB parameters (step S104), when determining that the wafer 12 is a wafer as an object for which data is to be acquired with values of device non-setting JOB parameters (step S102). The CPU 17 commands the alignment scope 15 and alignment signal processor 16 to perform an AGA measurement using current values of the device setting JOB parameters (step S103), when determining that the wafer 12 is not a wafer as an object for which data is to be acquired with values of device non-setting JOB parameters (step S102). Here, Advanced Global Alignment ("AGA") is one mode of a global alignment that performs a positional measurement of a wafer relying on accuracy of an XY stage with a laser interferometer, and calculates wafer magnification of the wafer 12, wafer rotation, shift amount as well as statistical processing, such as abnormal value detection. The CPU 17 sends an obtained AGA result to the PC 3.

The exposure apparatus 1 exposes the wafer 12 using AGA data measured with the values of the device setting JOB parameters (step S105). In parallel, the PC 3 stores, in the storage 4, information of the alignment mark measured by the exposure apparatus 1 in the steps S103 and S104 (step S107).

Before the exposed wafer 12 is brought out in step S106, the PC 3 determines, based on the database stored in the storage 4, whether or not current values of the device parameters are optimal (step S108).

The PC 3 sends optimized device parameter values to the CPU 17, when determining that the values of the device parameters are to be varied (step S109). In response, the exposure apparatus 1 varies the values of the device setting JOB parameters to optimal parameter values set by the PC 3 so as to reflect these values in the JOB for the next wafer 12 (step S110). The above process continues until all the wafers 12 are exposed (step S111).

Figure 9:
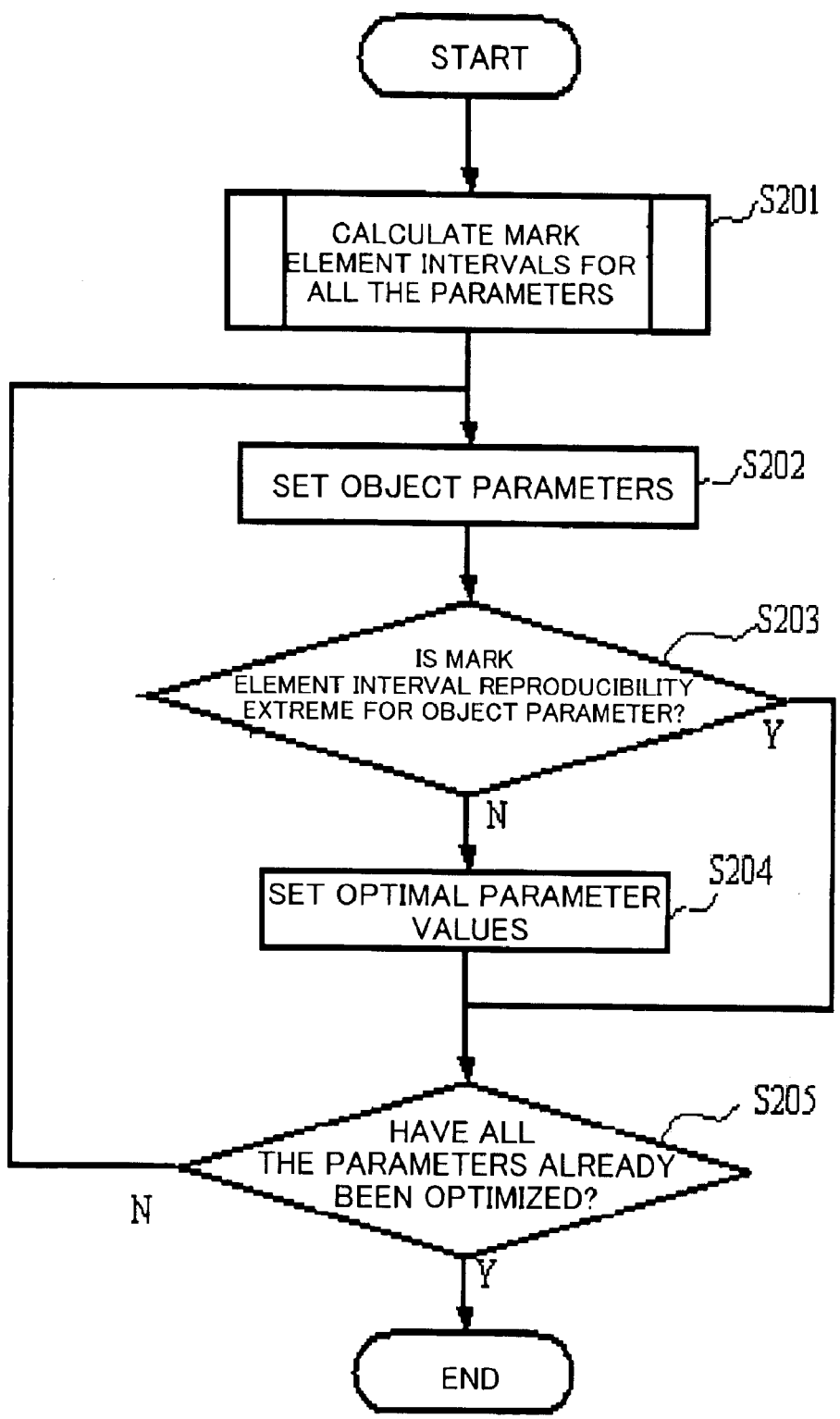
FIG. 9 is a detailed flowchart of an optimization process step shown in FIG. 6 etc.

A detailed description will now be given of the optimization process of the step S108 with reference to FIG. 9. Here, FIG. 9 is a detailed flowchart of the optimization process in the step S108. First, the PC 3 calculates mark element intervals for all the device parameters stored in the database in the memory 4 (step S201). Then, step S202 sets a device parameter as an optimization object (such as "mark line width MLW" in FIG. 10B), and then it is determined whether or not the value of the device setting JOB parameter for the device parameter is an extreme where the reproducibility of the mark element intervals is set to be a criterion of evaluation (step S203). As discussed below, the number of optimization object parameters is not limited to one but may be plural.

When the value of the device setting JOB parameter for the device parameter is an extreme where the reproducibility of the mark element intervals is set to be a criterion of evaluation, the device setting JOB parameter uses the current value, and sets the optimal parameter value if it is not the extreme (step S204). The above process is conducted for all the device parameters (step S205).

A concrete description will now be given of the step S203 shown in FIG. 9, with reference to FIG. 11. Here, FIG. 11 is a graph showing a relationship between the reproducibility of the mark element intervals and device parameter relating to two wafers. Suppose, for example, that as shown in FIG. 11, when curve 1 determines current parameters for a (K−1)-th wafer, and curve 2 defines the reproducibility of the mark element intervals for a K-th wafer. Then, step S204 newly sets the minimum value of the curve 2 to the optimal parameter value. The detailed flow of the optimization process shown in FIG. 9 is common to all of the embodiments which will be described later.

Figure 7:
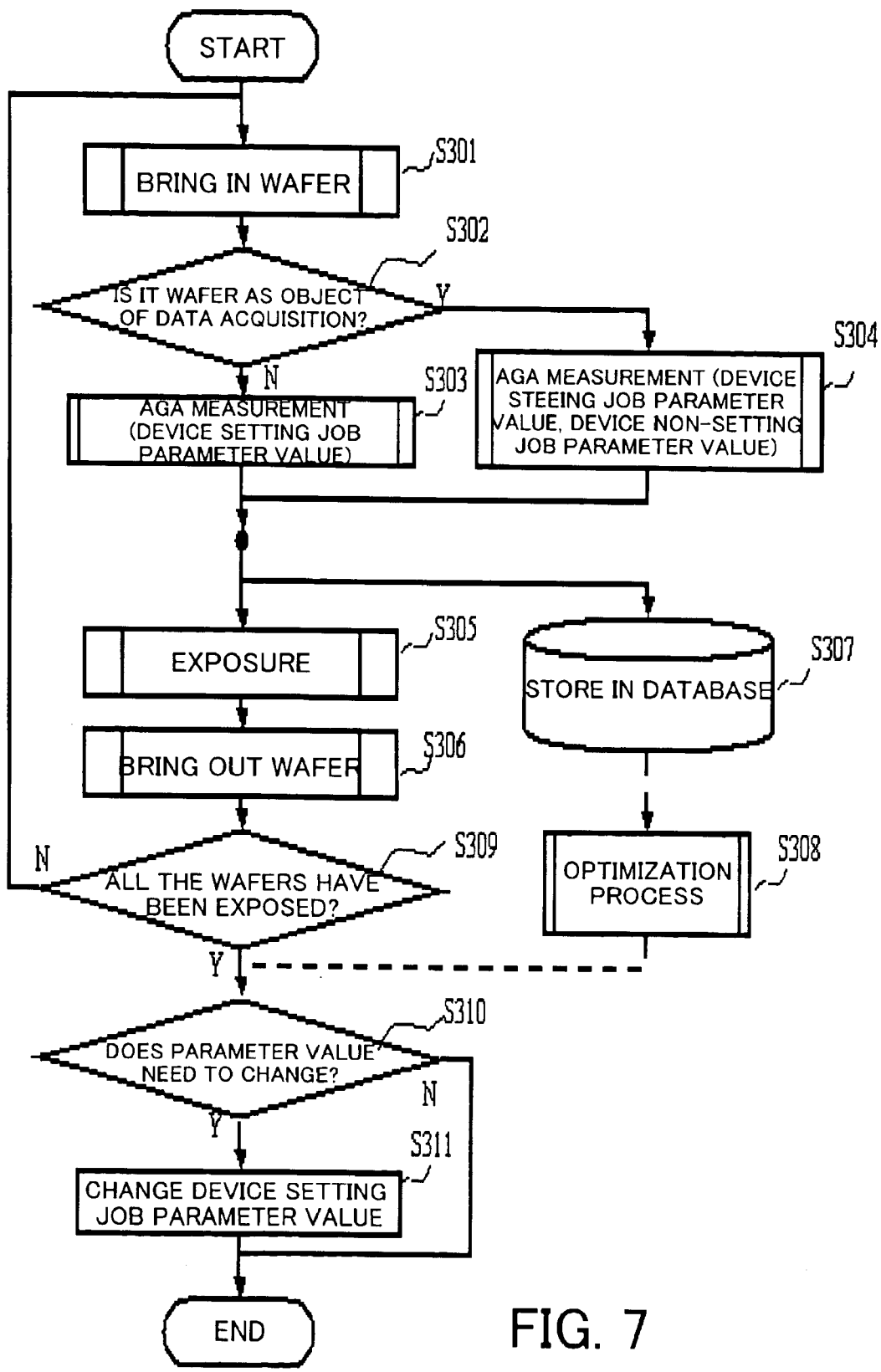
FIG. 7 is a flowchart of an optimization process of a second embodiment according to the present invention.

FIG. 7 is a flowchart of an optimization process of a second embodiment according to the present invention. FIG. 7 shows a process to optimize device parameters for each lot. First, the CPU 17 in the exposure apparatus 1 confirms that the wafer 12 has been brought in by using a sensor (not shown) etc. (step S301), and determines, based on an identifier formed on the wafer 12 or an external input, whether the wafer 12 is a wafer as an object for which data is to be acquired with values of the device non-setting JOB parameters (step S302).

The CPU 17 commands the alignment scope 15 and alignment signal processor 16 to perform an AGA measurement with device setting and non-setting JOB parameters (step S304), when determining that the wafer 12 is a wafer as an object for which data is to be acquired with values of device non-setting JOB parameters (step S302). The CPU 17 commands the alignment scope 15 and alignment signal processor 16 to perform the AGA measurement using current values of the device setting JOB parameters (step S303), when determining that the wafer 12 is not a wafer as an object for which data is to be acquired with values of device non-setting JOB parameters (step S302).

The exposure apparatus 1 exposes the wafer 12 using AGA data measured with the values of the device setting JOB parameters (step S305). In parallel, the PC 3 stores, in the storage 4, information of the alignment mark measured by the exposure apparatus 1 in the steps S303 and S304 (step S307).

Before the exposed wafer 12 is brought out in step S306, the PC 3 determines, based on the database stored in the storage 4, whether or not the current value of the device parameter are optimal (step S308). The difference from the first embodiment is that the optimization process of the device parameter values in the step S308 continues until all the wafers in one lot are exposed (step S309).

The exposed wafer 12 is brought out (step S306), and the above process continues until all the wafers 12 are exposed (step S309). The PC 3 sends optimized device parameter values to the CPU 17, when determining that the value of the device parameter is to be varied (step S310). In response, the exposure apparatus 1 varies the values of the device setting JOB parameters to optimal parameter value set by the PC 3 in the step S308 so as to reflect the JOB for the next lot (step S311).

A concrete description will be given of the step S203 in the optimization process shown in FIG. 9, with respect to the second embodiment. Suppose, for example, that curve group 1 represent, as shown in FIG. 12, the reproducibility of the mark element intervals for parameters of "N" wafers in a (M−1)-th lot. Then, the minimum value x(i) of the reproducibility of the mark element intervals is calculated for each of "N" wafers, and an averaged value by "N" is set as optimal parameter value P(M) for the M-th lot as shown in Equation 4. Here, FIG. 12 is a graph showing a relationship between the mark interval in one lot and device parameters.

$$P(M) = \frac{\sum_{i=1}^{N} x(i)}{N} \quad (4)$$

Figure 8:
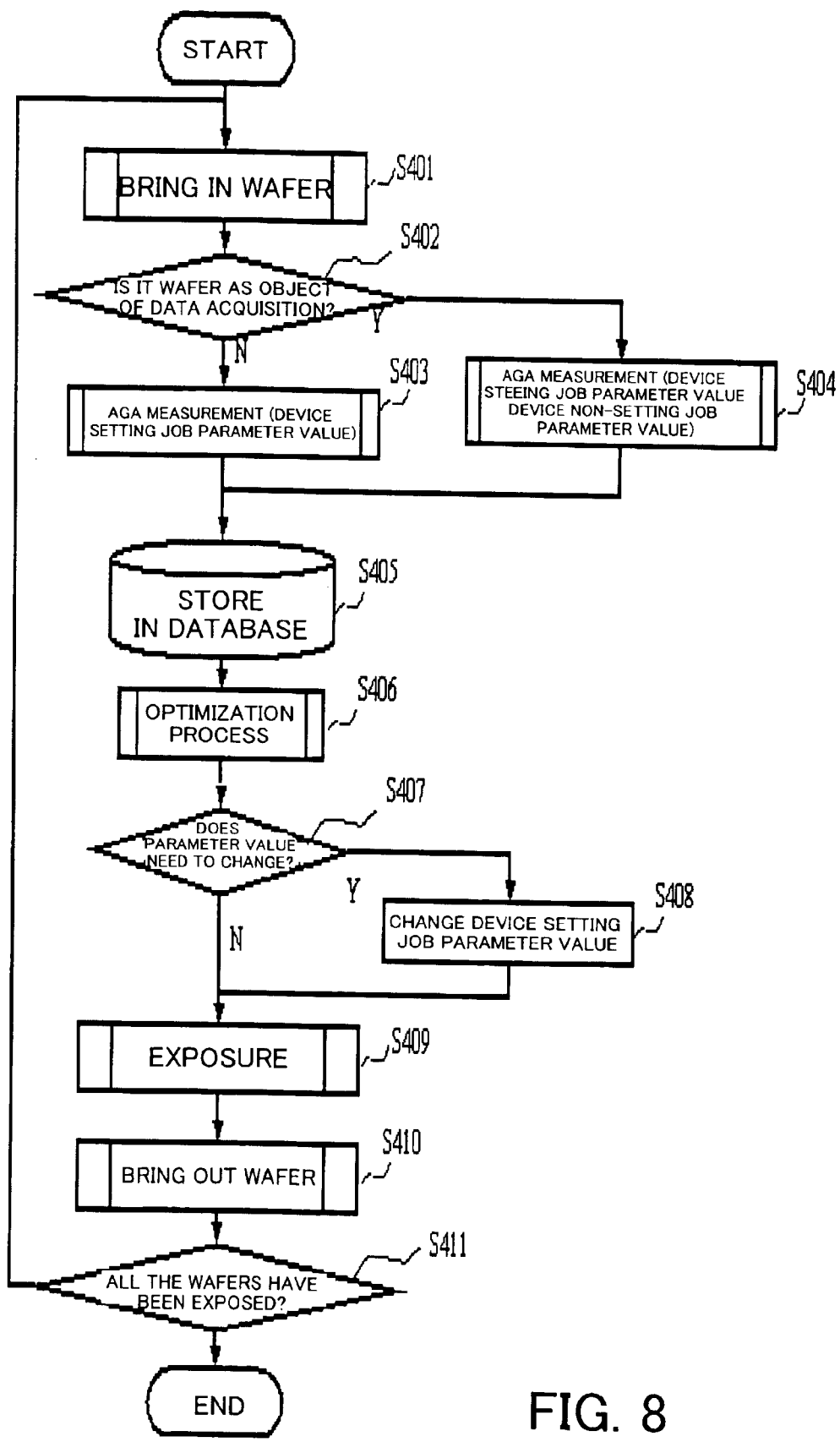
FIG. 8 is a flowchart of an optimization process of a third embodiment according to the present invention.

FIG. 8 shows a flowchart of an optimization process of a third embodiment according to the present invention. FIG. 8 shows a process to optimize device parameter values prior to exposure. First, the CPU 17 in the exposure apparatus 1 confirms that the wafer 12 has been brought in using a sensor (not shown), etc. (step S401), and determines, based on an identifier formed on the wafer 12 or an external input, whether the wafer 12 is a wafer as an object for which data is to be acquired with values of the device non-setting JOB parameters (step S402).

The CPU 17 instructs the alignment scope 15 and alignment signal processor 16 to perform an AGA measurement with device setting and non-setting JOB parameters (step S404), when determining that the wafer 12 is a wafer as an object for which data is to be acquired with values of device non-setting JOB parameters (step S402). The CPU 17 instructs the alignment scope 15 and alignment signal processor 16 to perform the AGA measurement using current values of the device setting JOB parameters (step S403), when determining that the wafer 12 is not a wafer as an object for which data is to be acquired with values of device non-setting JOB parameters (step S402).

A difference from the first embodiment is that the optimization process to the device parameter value in the step S406 is conducted prior to exposure to the wafer 12 in the step 409.

The PC 3 stores information of the alignment mark measured by the exposure apparatus 1 in the steps S403 and S404 in the storage 4 (step S405). The PC 3 determines whether or not the current device parameter value is optimal based on the database stored in the storage 4 (step S406). The PC 3 sends optimized device parameter values to the CPU 17, when determining that the value of the device parameter is to be varied (step S407). In response, the exposure apparatus 1 varies the values of the device setting JOB parameters to optimal parameter value set by the PC 3 in the step S407 so as to reflect the value in the JOB for the next lot (step S408).

In the exposure operation in step S409, when the step S407 determines that the value of the device setting JOB parameter for the wafer does not have to be changed, the AGA correction is driven with the device setting JOB parameters. On the other hand, when the value of the device setting JOB parameter needs to be changed, the AGA correction is driven with parameter values varied in step S204, followed by the exposure. The exposed wafer 12 is brought out (step S410), and the above process continues until all the wafers 12 are exposed (step S411).

Figure 14:
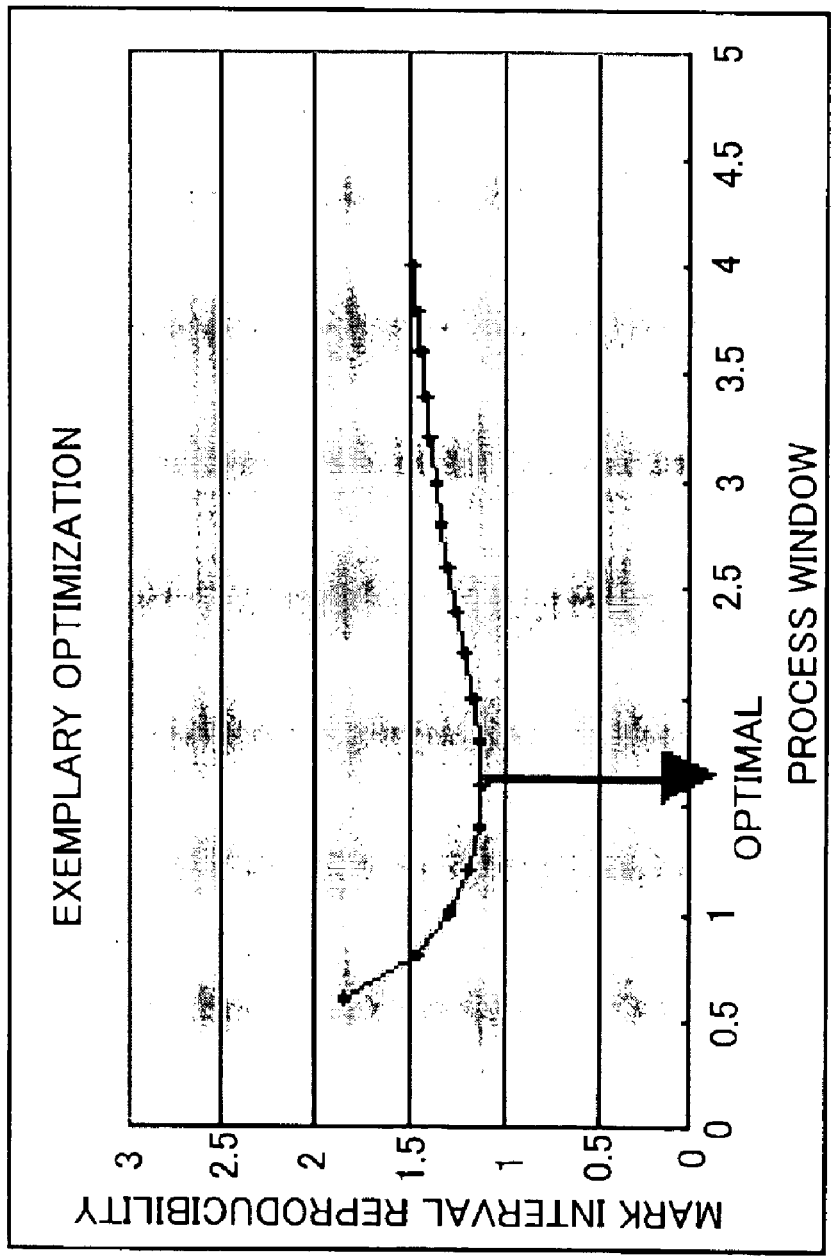
FIG. 14 is a graph of a fourth embodiment according to the present invention.
Figure 15:
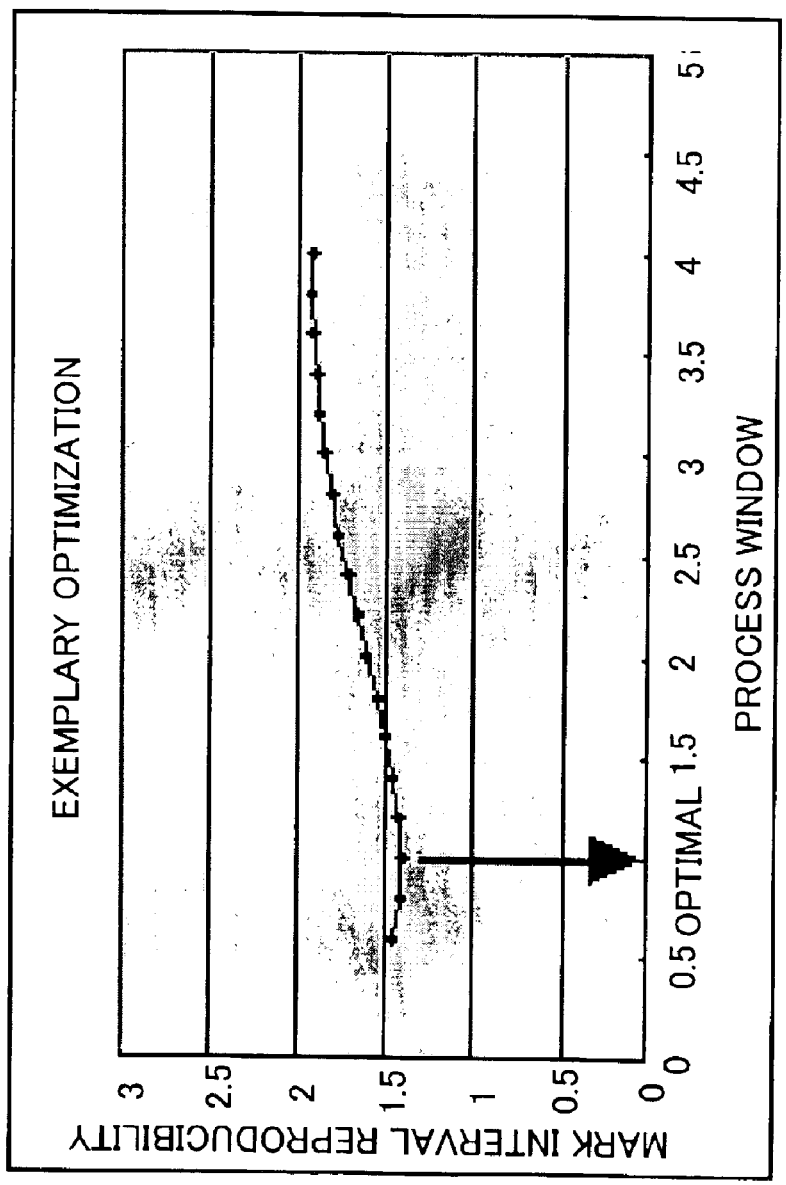
FIG. 15 is a graph showing another example of the fourth embodiment according to the present invention.

A concrete description will be given of the optimization process in the step S203 shown in FIG. 9 of the third embodiment. For example, when curve 1 represents, as shown in FIG. 13, the reproducibility of the mark element interval for parameters of "K" wafers, there is a minimum area lower than the current value and the step S204 newly sets the minimum value of the curve to an optimal parameter value. Here, FIG. 13 is a graph showing a relationship between the mark interval in one lot and device parameters. FIGS. 14 and 15 are graphs of a fourth embodiment according to the present invention. Among the device parameters, this embodiment typifies an optimization of a process window width of a detection signal of the alignment mark 30, which has been discussed with reference to FIG. 10C. FIGS. 14 and 15 set an abscissa axis to the process window width, and an ordinate axis to the reproducibility of the mark element intervals, wherein the optimal process window width is different according to the mark line widths. FIG. 14 is an exemplary optimization of a process window width for the mark line width of a certain value W1, while FIG. 15 is an exemplary optimization of a process window width for the mark line width of a certain value W2. In other words, the optimized device parameters in the instant embodiment may set extremes to the optimal parameter values.

Figure 16:
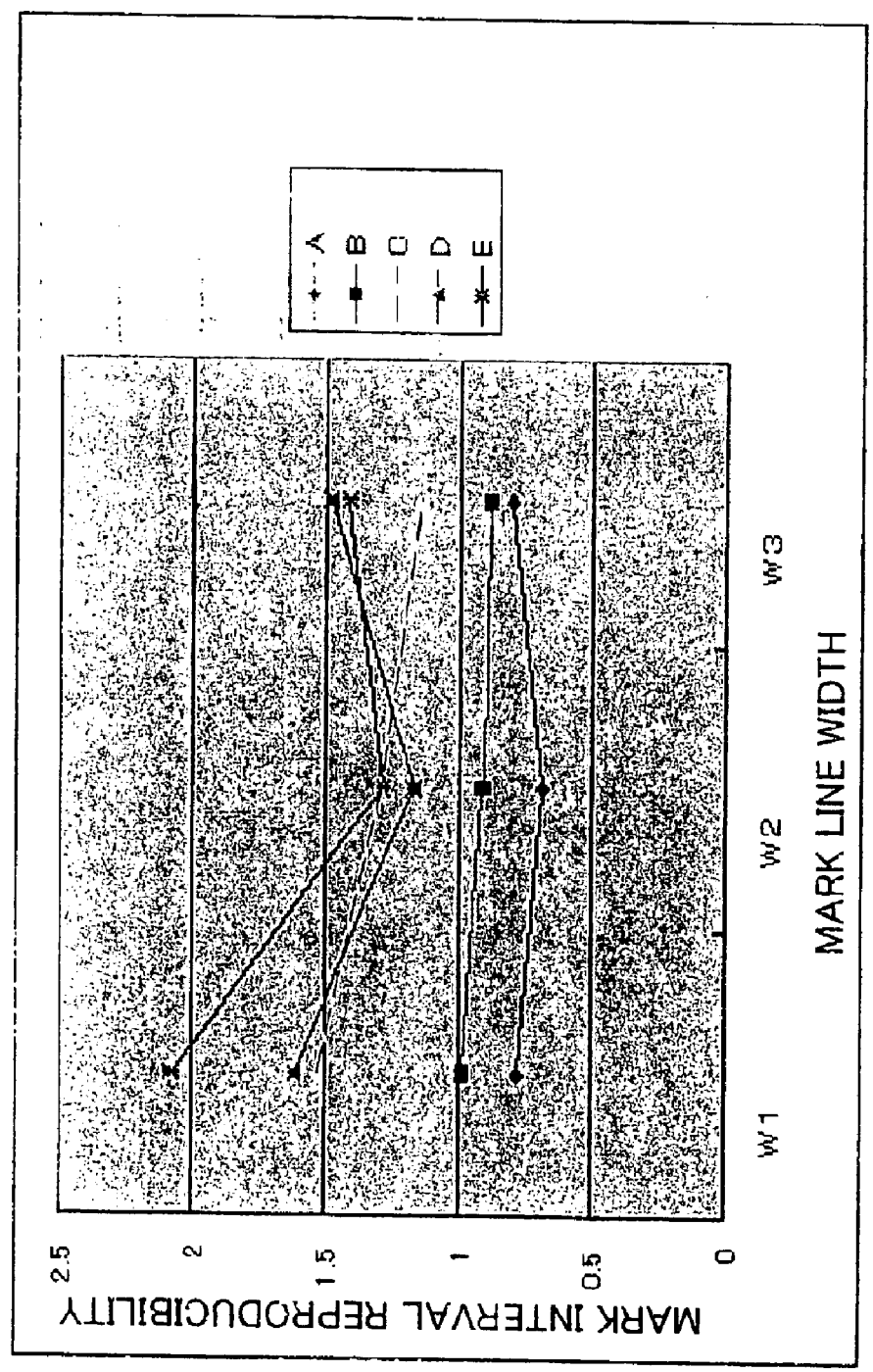
FIG. 16 is a view and graph of a fifth embodiment according to the present invention.

FIG. 16 is a graph showing an exemplary optimization of a fifth embodiment according to the present invention, wherein a mark line width ("MLW") changes among the device parameters. FIG. 16 is a graph by plotting the reproducibility of the mark element intervals for different processes A to E for three types of mark line widths, and the MLW's optimal parameter value differs according to processes. According to the optimization of the device parameter values in the instant embodiment, the MLW W2 is optimal for the process conditions A, D and E, and the MLW W3 is optimal for the process conditions C and D. In order to facilitate understanding of the present invention, a color version of FIG. 16 is attached to the instant application.

Figures 17A, 17B:
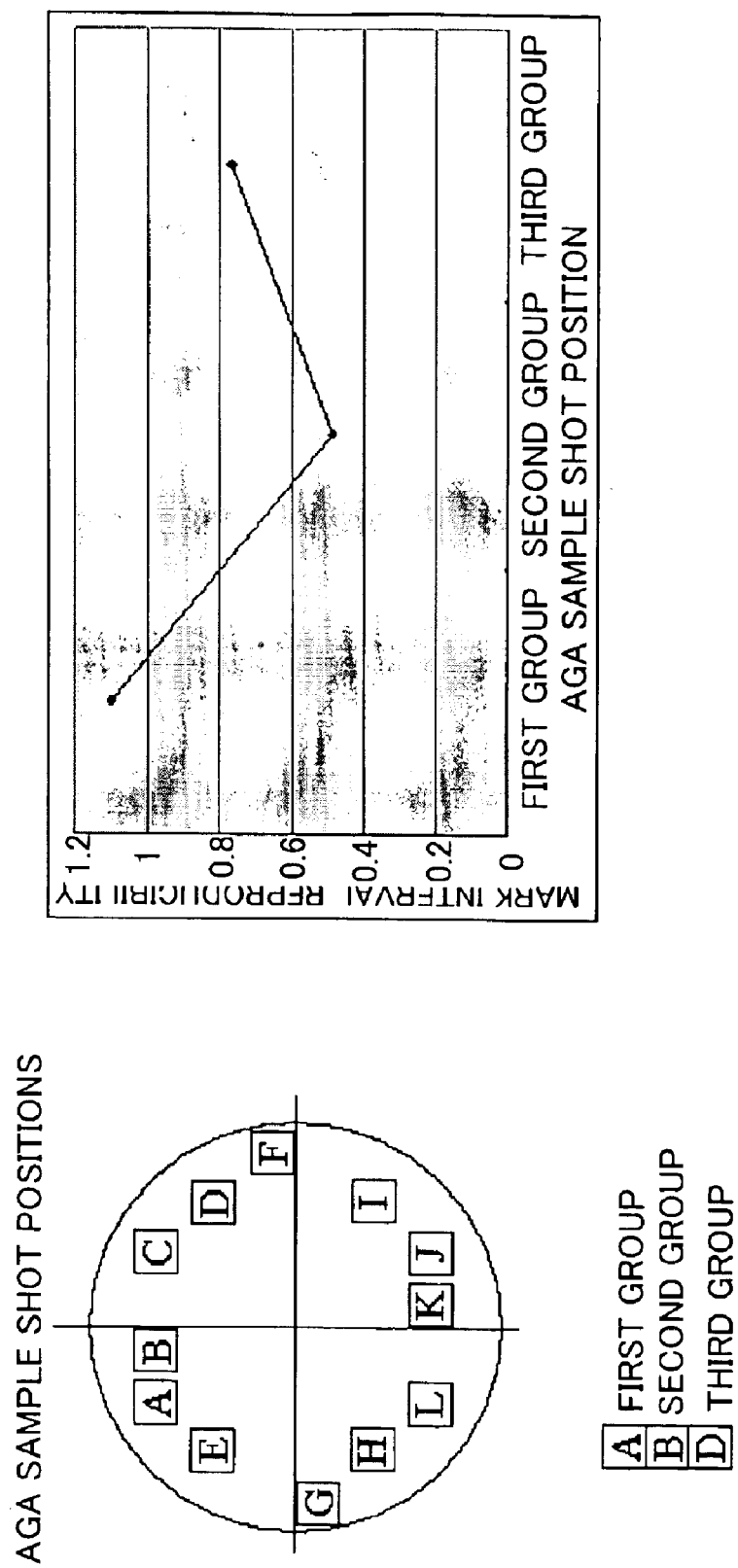
FIG. 17 is a graph of a sixth embodiment according to the present invention.

FIG. 17 shows a sixth embodiment according to the present invention. FIG. 17A shows a view of an arrangement of AGA sample shots used for the alignment. FIG. 17B is a graph showing a relationship between the arrangement of the AGA sample shots shown in FIG. 17A among the device parameters, and the reproducibility of the mark element intervals. It is understood that a second group of the reproducibility of the mark element intervals has the minimum value when the AGA sample shots are classified, as shown in FIG. 17A, into a first group has shots A, C, J and L, the second group has shots B, F, K and G, and a third group has shots D, E, H and I. Therefore, the optimization of the device parameter values in the instant embodiment selects the second group of the AGA sample shot arrangement.

Figure 18:
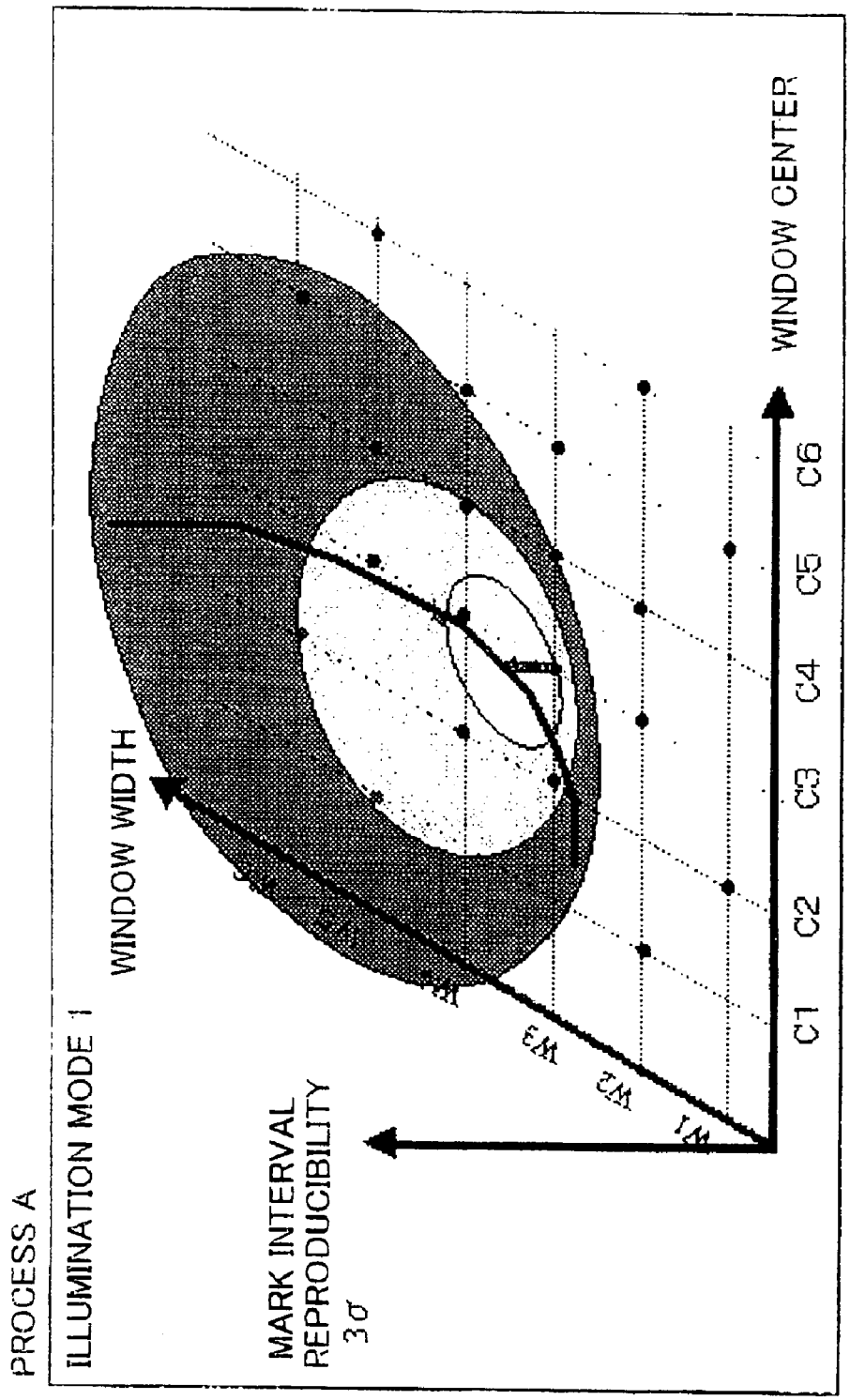
FIG. 18 is a conceptual graph of a seventh embodiment according to the present invention.

FIG. 18 shows a concept of optimization of a seventh embodiment according to the present invention, when the device parameters are a combination of plural parameters. More specifically, FIG. 18 is a graph formed by three-dimensionally plotting the reproducibility of the mark element intervals while values of parameters 1 and 2 are continuously varied outside the apparatus. Here, the parameters 1 and 2 are, for example, a process window width and a process window center distance in the above signal processing. In case of FIG. 18, a combination of optimal parameter values is (C3, W3) as an extreme region of the reproducibility of the mark element intervals.

Figure 19:
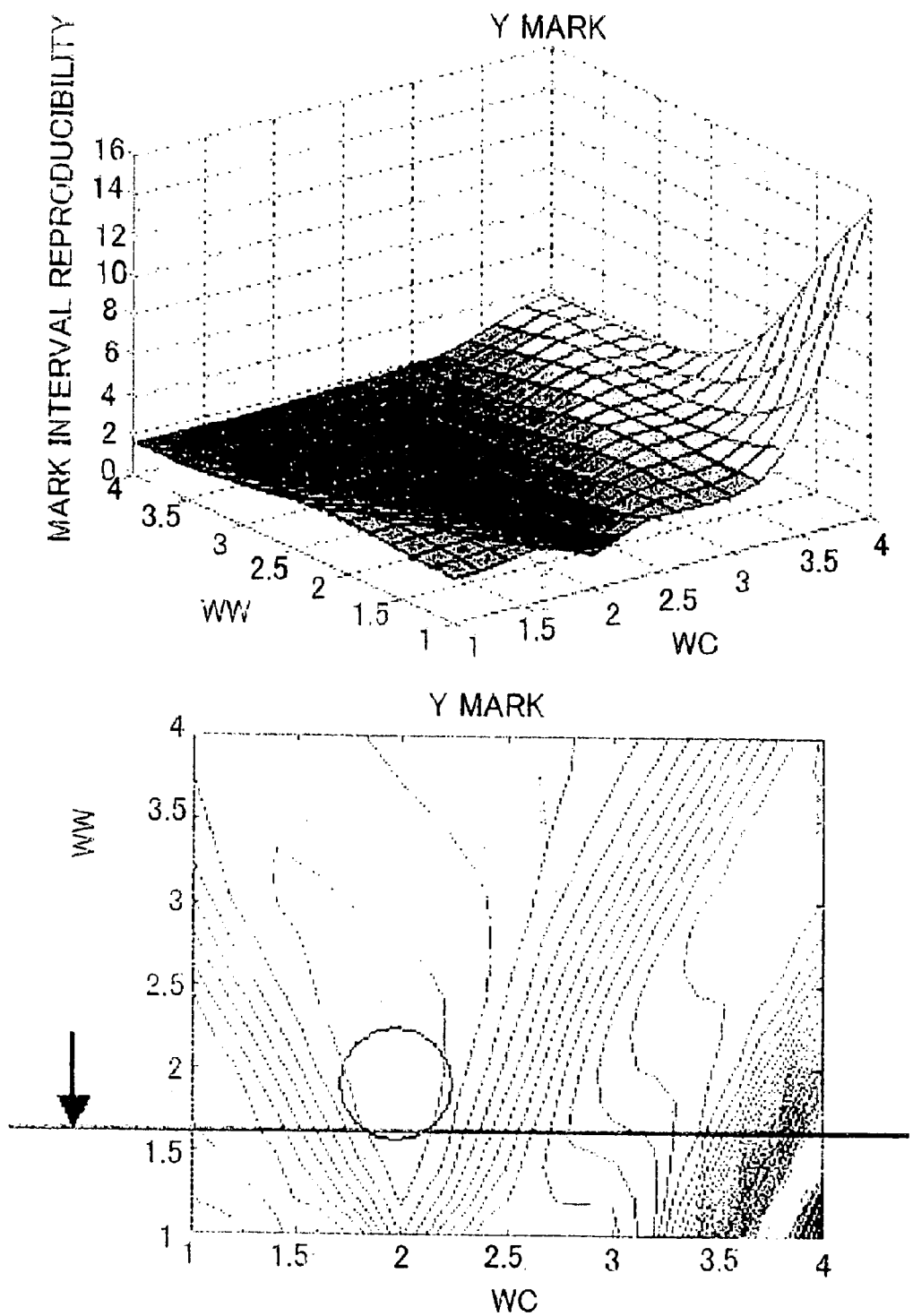
FIG. 19 is an exemplary graph of the seventh embodiment according to the present invention.

FIG. 19 shows an example of two optimal device parameters of the seventh embodiment according to the present invention. FIG. 19 is a three-dimensional plot of the reproducibility of the mark element interval and its plane view (or contour map), where the process window WW and process window center distance WC shown in FIG. 10 are signal-processed in the X and Y axes among the parameters for alignment signal processing, and plural shots on the wafer 12. In order to facilitate understanding of the present invention, a color version of FIGS. 17 and 18 is attached to the instant application.

An optimization of parameter values often need to narrow parameters in view of definite factors, if the reproducibility of the mark element intervals does not have a definite minimum value or there are plural parameter combinations. For example, while the reproducibility of the mark element intervals is found to have an extreme value as circled in FIG. 19, there are plural parameter combinations. In the plane view of FIG. 19, a parameter perpendicular to the paper is a process window width WW for signal processing; as its value reduces, the throughput effectively improves. Therefore, a combination of parameter values under the circle is preferably selected.

Figure 20:
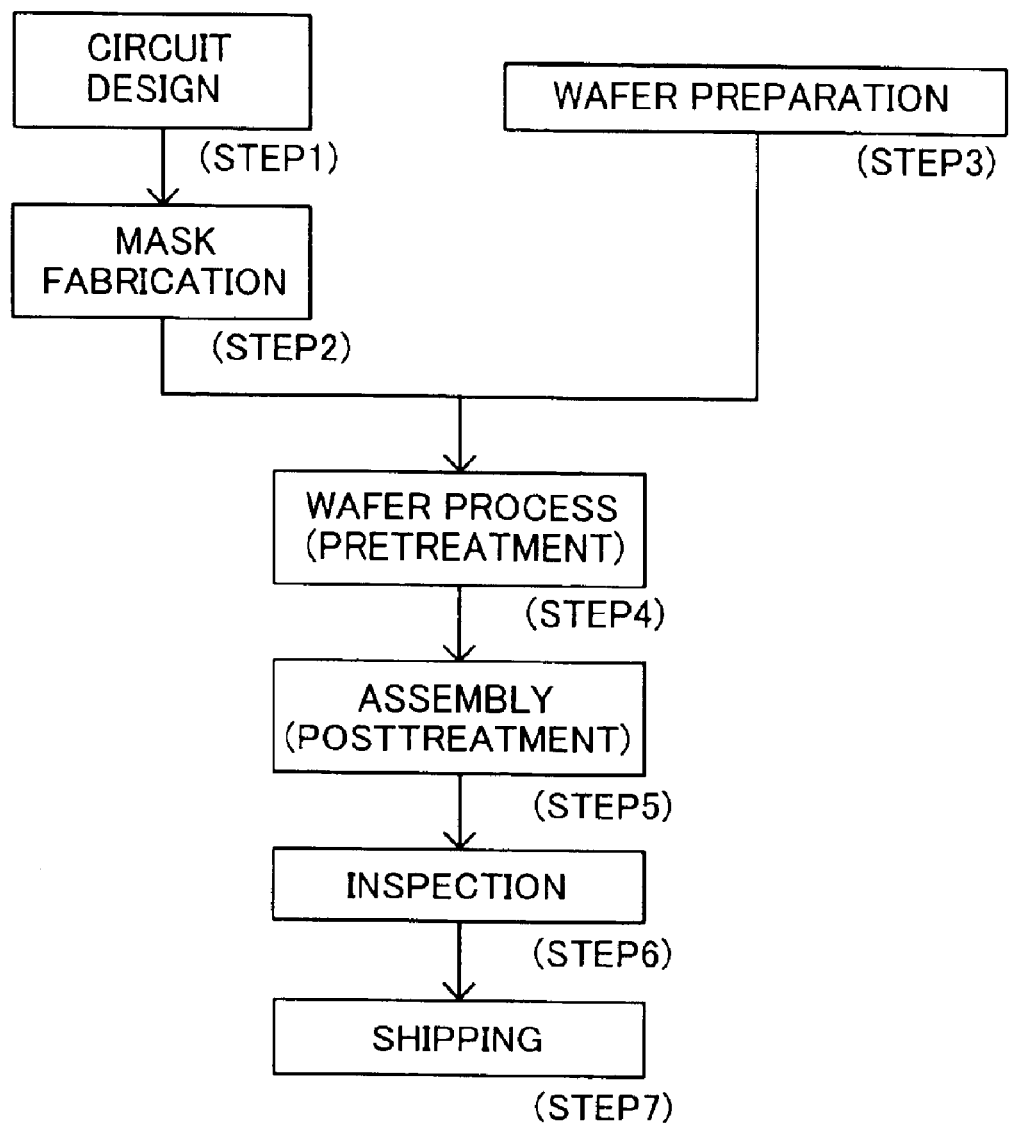
FIG. 20 is a flowchart for explaining a device fabrication method having an inventive exposure step.
Figure 21:
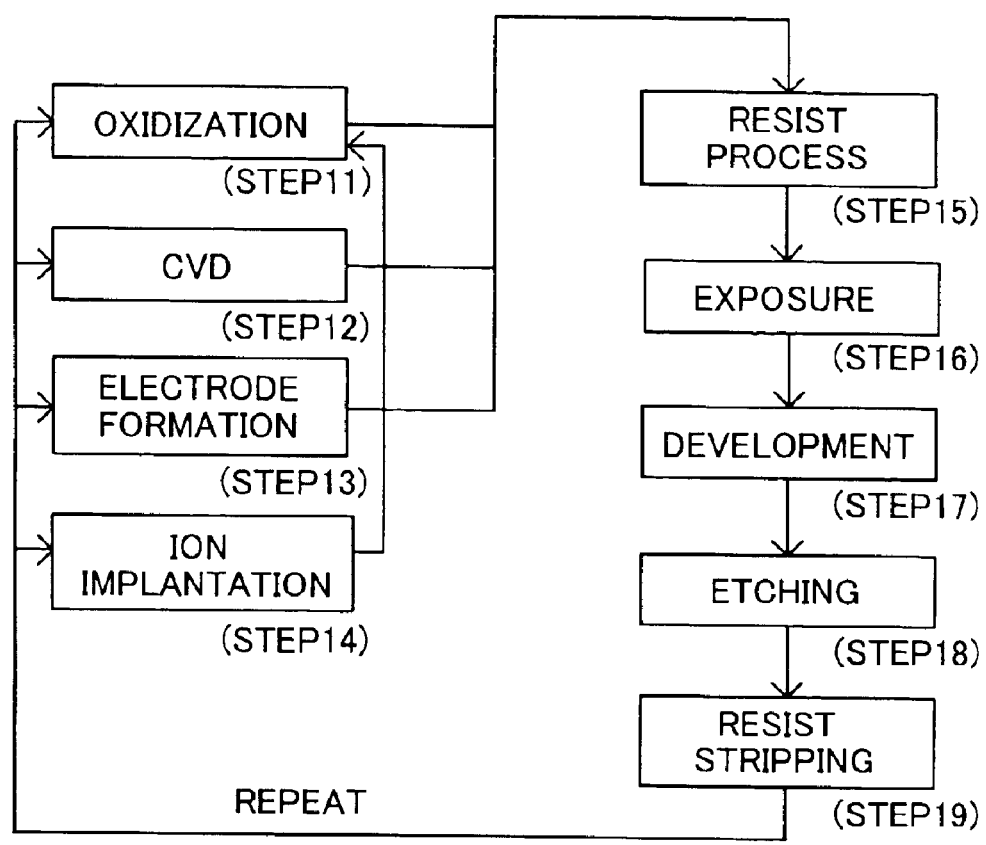
FIG. 21 is a detailed flowchart of step 4 in FIG. 20.

Referring now to FIGS. 20 and 21, a description will be given of an embodiment of a device fabricating method using the above exposure apparatus 1. FIG. 20 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 21 is a detailed flowchart of the wafer process in Step 4 in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. According to the instant embodiment, the exposure apparatus 1 sets optimized device parameters and may manufacture high quality devices with good yield. The step of obtaining information on alignment mark may be performed within a certain region including an optimal area for device parameters in another exposure apparatus. Thereby, the certain region including the optimal area for the device parameters obtained in a certain exposure apparatus is used to optimize another exposure apparatus, the optimized region may be readily discovered without measuring all the regions on the other exposure apparatus.

Further, the present invention is not limited to these preferred embodiments and various variations and modifications may be made without departing from the scope of the present invention. For example, while the object in the instant embodiment is a single crystal substrate for a semiconductor wafer, the present invention is applicable to a LCD glass plate, sphere semiconductor, etc.

The instant embodiments may provide a precise and prompt alignment under circumstance where WIS may occur as a wafer process error. The instant embodiments may optimize device parameter values for a semiconductor exposure apparatus without spending a lot of time and cost in determining values of the device parameters, enabling the exposure apparatus to be used with high productivity and device performance, and realizing a manufacture system having good CoO. Use of the optimization of device parameters of the instant embodiment would improve the effective performance, productivity and yield of the exposure apparatus even when a process error, such as WIS, occurs, since the exposure apparatus has set more robust device parameters.

Moreover, the instant embodiment may inexpensively determine optimal device parameter values even under circumstance where there is no overlay detector for determining optimal device parameter values.

Thus, the present invention may provide an exposure method and apparatus, and an optimization method and system, which may optimize device parameters of an exposure apparatus by determining whether or not device parameter values that have been set to the exposure apparatus are optimal.

What is claimed is:

1. An exposure method comprising steps of:
    acquiring information of an image of an alignment mark formed on an object to be exposed, with respect to each of a plurality of values of a parameter, the information being used for an alignment between a reticle and the object, the reticle having a pattern to be transferred to the object, and the parameter concerning the alignment and set in an exposure apparatus;
    determining the value of the parameter to be set in the exposure apparatus based on reproducibility of the image of which information has been acquired with respect to each of the plurality of values of the parameter in said acquiring step; and
    transferring the pattern to the object using the exposure apparatus in which the determined value is set as the parameter.

2. A method according to claim 1, wherein the reproducibility is defined by an interval between elements in the image.

3. A method according to claim 2, wherein the reproducibility is defined by deviations of a plurality of the interval.

4. A method according to claim 3, wherein the deviations are deviations of the plurality of the interval from an average of the plurality of the interval.

5. A method according to claim 3, wherein the deviations are deviations of the plurality of the interval from a designated value of the interval.

6. A method according to claim 1, wherein said determining step determines the value of the parameter so that the reproducibility of the image improves.

7. A method according to claim 1, wherein said determining step is repeated to acquire plural determined values of the parameter, and said transferring step uses an average of the plural determined values of the parameter.

8. A method according to claim 1, wherein said method is applied to a combination of a plurality of the parameter.

9. A method according to claim 1, wherein the parameter defines an arrangement of sample shots used for a global alignment.

10. A method according to claim 1, wherein the parameter defines a mode of illuminating the alignment mark.

11. A method according to claim 1, wherein the parameter defines a width of an element of the alignment mark in an alignment measurement direction.

12. A method according to claim 1, wherein the parameter defines a width of a line element of the alignment mark.

13. A method according to claim 1, wherein the parameter defines a process parameter used to process a detection signal of the alignment mark.

14. A method according to claim 13, wherein the parameter defines a width of a process window.

15. A method according to claim 13, wherein the parameter defines a position of a process window.

16. A program that enables a computer to execute an exposure method, said method comprising:

acquiring information of an image of an alignment mark formed on an object to be exposed, with respect to each of a plurality of values of a parameter, the information being used for an alignment between a reticle and the object, the reticle having a pattern to be transferred to the object, and the parameter concerning the alignment and set in an exposure apparatus;

determining the value of the parameter to be set in the exposure apparatus based on reproducibility of the image of which information has been acquired with respect to each of the plurality of values of the parameter in said acquiring step; and transferring the pattern to the object using the exposure apparatus in which the determined value is set as the parameter.

17. An exposure apparatus for transferring a pattern formed on a reticle to an object to be exposed, said apparatus comprising:

an acquiring system which acquires information of an image of an alignment mark formed on the object, with respect to each of a plurality of values of a parameter, the information being used for an alignment between the reticle and the object, and the parameter concerning the alignment and set in said exposure apparatus; and a determining unit which determines the value of the parameter to be set in said exposure apparatus based on reproducibility of the image of which information has been acquired with respect to each of the plurality of values of the parameter by said acquiring system.

18. A device fabrication method comprising steps of:

exposing an object using an exposure method; and developing the exposed object, wherein said exposure method comprises steps of:

acquiring information of an image of an alignment mark formed on an object to be exposed, with respect to each of a plurality of values of a parameter, the information being used for an alignment between a reticle and the object to be exposed, the reticle having a pattern to be transferred to the object to be exposed, and the parameter concerning the alignment and set in an exposure apparatus;

determining the value of the parameter to be set in the exposure apparatus based on reproducibility of the image of which information has been acquired with respect to each of the plurality of values of the parameter in said acquiring step; and transferring the pattern to the object to be exposed using the exposure apparatus in which the determined value is set as the parameter.

* * * * *